US008405169B2

(12) United States Patent
Cheng et al.

(10) Patent No.: US 8,405,169 B2
(45) Date of Patent: Mar. 26, 2013

(54) HANDLING LAYER FOR TRANSPARENT SUBSTRATE

(75) Inventors: Chun-Ren Cheng, Hsin-Chu (TW); Yi-Hsien Chang, Shetou Township, Changhua County (TW); Allen Timothy Chang, Hsinchu (TW); Ching-Ray Chen, Taipei (TW); Li-Cheng Chu, Taipei (TW); Hung-Hua Lin, Taipei (TW); Yuan-Chih Hsieh, Hsinchu (TW); Lan-Lin Chao, Sindian (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 188 days.

(21) Appl. No.: 12/905,358

(22) Filed: Oct. 15, 2010

(65) Prior Publication Data

US 2012/0091598 A1 Apr. 19, 2012

(51) Int. Cl.
*H01L 27/14* (2006.01)
*H01L 21/00* (2006.01)

(52) U.S. Cl. ......... 257/414; 257/E27.001; 257/E21.002; 438/48

(58) Field of Classification Search .................... 257/49, 257/52, 57, 59, 66, 72, 213, 288, 347, 352, 257/414, 428, 431–466, 797; 438/142, 149–166, 438/400, 401, 584, 597, 680
See application file for complete search history.

(56) References Cited

U.S. PATENT DOCUMENTS

| | | | | |
|---|---|---|---|---|
| 4,892,753 | A * | 1/1990 | Wang et al. | 427/579 |
| 6,403,479 | B1 * | 6/2002 | Watanabe et al. | 438/680 |
| 2002/0197761 | A1 * | 12/2002 | Patel et al. | 438/52 |
| 2003/0113971 | A1 * | 6/2003 | Nagaoka et al. | 438/287 |
| 2005/0202649 | A1 * | 9/2005 | Hung et al. | 438/435 |
| 2008/0157081 | A1 * | 7/2008 | Huh | 257/59 |

OTHER PUBLICATIONS

Wook Lee, Neal A. Hall, Zhiping Zhou and F. Levent Degertekin; "Fabrication and Characterization of a Micromachined Acoustic Sensor With Integrated Optical Readout;" IEEE Journal of Selected Topics in Quantum Electronics, pp. 643-651; vol. 10, No. 3, May/Jun. 2004.

* cited by examiner

*Primary Examiner* — Ha Tran T Nguyen
*Assistant Examiner* — Kevin Quinto
(74) *Attorney, Agent, or Firm* — Haynes and Boone, LLP

(57) ABSTRACT

A device is provided which includes a transparent substrate. An opaque layer is disposed on the transparent substrate. A conductive layer disposed on the opaque layer. The opaque layer and the conductive layer form a handling layer, which may be used to detect and/or align the transparent wafer during fabrication processes. In an embodiment, the conductive layer includes a highly-doped silicon layer. In an embodiment, the opaque layer includes a metal. In embodiment, the device may include a MEMs device.

20 Claims, 4 Drawing Sheets

302
402
502
602
604

HANDLING LAYER FOR TRANSPARENT SUBSTRATE

BACKGROUND

Many micro-electromechanical systems (MEMS) require transparent substrates which allow light to pass through the substrate and to and through features of the device. Examples of such MEMS devices include BioMEMs, which include devices where biological material is manipulated to analyze and measure its activity, and Optical MEMs or micro-opto-electromechanical systems (MOEMS). MOEMs devices may be used for optical switching, scanners, displays, and various other optical applications.

There can be issues with the use of transparent substrates (e.g., wafers) during the device fabrication processes. Many fabrication tools can not locate or recognize a transparent substrate with the typical detection methods employed. For example, typical tools may use radiation that is reflected from the substrate to determine a substrate's presence and/or alignment. With transparent substrates, the radiation may not be sufficiently reflected.

Thus, what is needed is an improved design for a transparent substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. The term "wafer" is used herein to describe a substrate upon which one or more devices will be formed through fabrication processes.

The present application discusses transparent substrates in the context of MEMS devices. However, other devices which use a transparent substrate, now known or later developed, may benefit from, and are within the scope of, the present disclosure.

Figure 1:
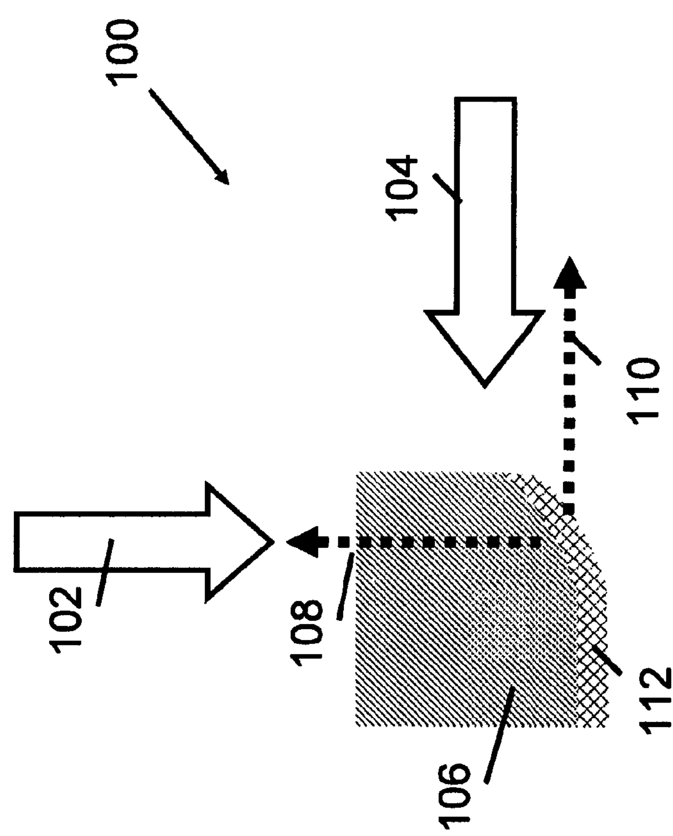
FIG. 1 illustrates an embodiment of a wafer detection system.

Illustrated in FIG. 1 is an embodiment of a wafer detection system 100. The wafer detection system 100 includes a first radiation beam 102 and a second radiation beam 104. The first radiation beam 102 and the second radiation beam 104 may include any suitable type of radiation including, for example, infrared and/or visible light. In an embodiment, the beam 102 is used to detect a notch in a wafer 106. The notch may distinguish an alignment of the wafer 106 in a process tool. In an embodiment, the beam 104 is used to locate a wafer in a cassette, which is typically used to transfer wafers through the fabrication process. The beam 102 produces a reflected beam 108; the beam 104 produces a reflected beam 110. The reflected beams 108 and/or 110 may be detected and/or measured by the wafer detection system 100 to determine alignment and/or presence of the wafer 106.

In an embodiment, the wafer 106 is a transparent material. Example transparent materials include glass and quartz, though other transparent materials may be possible. A handling layer 112 is formed on the transparent wafer 106. The handling layer 112 may include a plurality of layers (opaque and non-opaque) formed on the backside of the wafer 106. The handling layer 112 reflects the beams 102 and/or 104, producing reflected beams 108 and/or 110. In the absence of the handling layer 112, the beams 102 and/or 104 may pass through the transparent wafer 106 providing erroneous results to the wafer detection system 100.

A desirable composition for the handling layer 112 would be compatible with a CMOS environment as a CMOS process technology is typically used to form one or more features of included in a MEM device. Additionally, it is desirable for the handling layer 112 to be conductive to reduce plasma arcing issues during etching processes used in fabrication. The arcing may be caused by parasitic capacitance that forms between portions of the layer 112 and/or charge accumulation on the layer 112. Other desirable properties include: withstanding scratching, minimizing particle generation, minimizing contamination (e.g., metal contamination), avoiding static charge generation when removing the wafer 106 from a fabrication tool, minimizing bowing of the wafer 106, resisting chemicals typical of the fabrication process, providing thermal conductivity, and providing reflection. The handling layer 112 may be a single layer or a plurality of layers, which provide one or more of the properties described above. In an embodiment, the handling layer is substantially similar to a handling layer 604, described with reference to FIG. 6.

Figure 2:
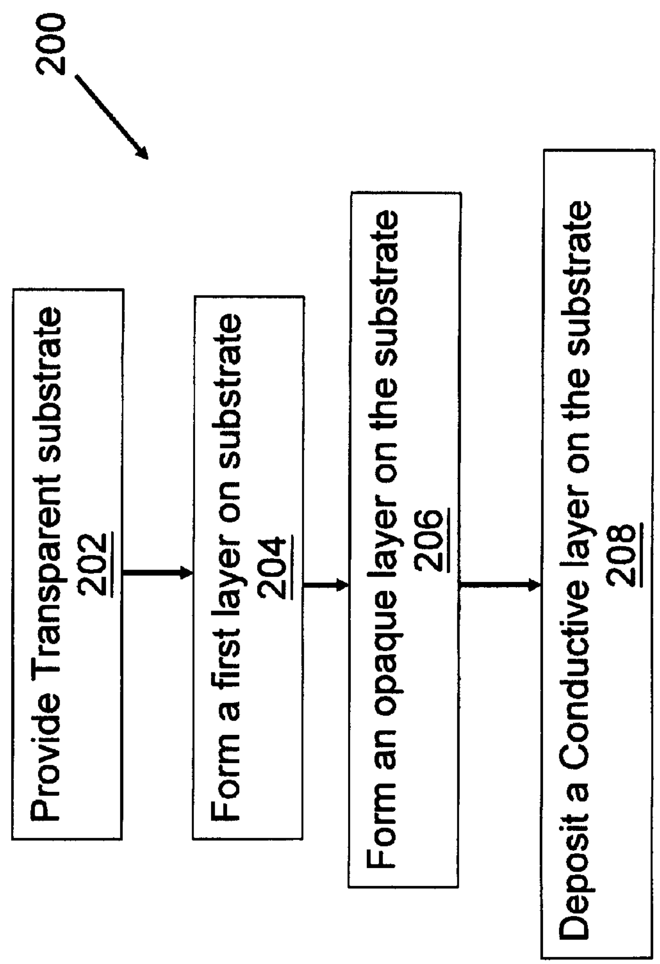
FIG. 2 illustrates an embodiment of a method of fabricating a wafer.
Figure 4:
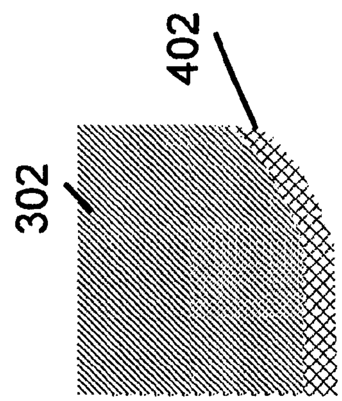
FIGS. 3, 4, 5, and 6 illustrate perspective views of embodiments of a substrate according to the steps of the method of FIG. 2.
Figure 3:
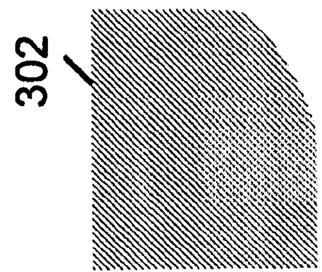

Referring now to FIG. 2, illustrated is a method 200 of fabricating a wafer. The method 200 may provide for a substrate that has one or more of the above described desired properties. FIGS. 3, 4, 5, and 6 are exemplary embodiments illustrating steps of the method 200.

The method 200 begins at block 202 where a substrate is provided. The substrate is substantially transparent. The substrate may be referred to herein as a wafer. In an embodiment, the substrate is glass, quartz, and/or other suitable transparent material. Referring to the example of FIG. 3, a wafer 302 is illustrated. The wafer 302 includes a transparent material. A MEMs device or portion thereof may be formed or may be subsequently formed on the wafer 302. A CMOS device or portion thereof may also be formed or may subsequently be formed on the wafer 302. In an embodiment, the wafer 302 is quartz. Other example compositions include glass and/or other suitable transparent materials. The wafer 302 may be a suitable substrate upon which a plurality of devices are formed, which may include MEMs and/or semiconductor (e.g., CMOS) devices.

The method 200 then proceeds to block 204 where a first layer is formed on the substrate (e.g., wafer). In an embodiment, the first layer is polysilicon (polycrystalline silicon). In a further embodiment, the first layer is amorphous silicon (a-Si). The first layer may be formed using low-pressure chemical vapor deposition (LPCVD), plasma enhanced chemical vapor deposition (PECVD), and/or other suitable methods. Referring to the example of FIG. 4, a layer 402 is formed on the transparent wafer 302. In an embodiment, one or more features (e.g., MEMs devices, CMOS devices) may be formed (or subsequently formed) on the opposite (e.g., opposing) surface of the wafer 302 (in other words, the surface of the wafer opposing that surface having the layer 402). The layer 402 may include polysilicon and/or amorphous silicon. In an embodiment, the layer 402 has a thickness between approximately 0.5 μm and approximately 1.5 μm.

The method 200 then proceeds to block 206 where an opaque layer is formed on the substrate. The opaque layer may be a reflective layer. The opaque layer may include a metal. Example compositions of the opaque layer include titanium (Ti), titanium nitride (TiN), aluminum (Al), tungsten (W), copper (Cu), gold (Au), and/or combinations thereof The thickness of the opaque layer may be between approximately 1.5 kilo-angstroms and approximately 8 kilo-angstroms. The opaque layer may be formed using physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other suitable processes. The opaque layer may provide a reflectively between approximately 50% and approximately 99% of the incident radiation. The radiation may include wavelengths of light in the red, green, and/or blue spectrum.

Figure 5:
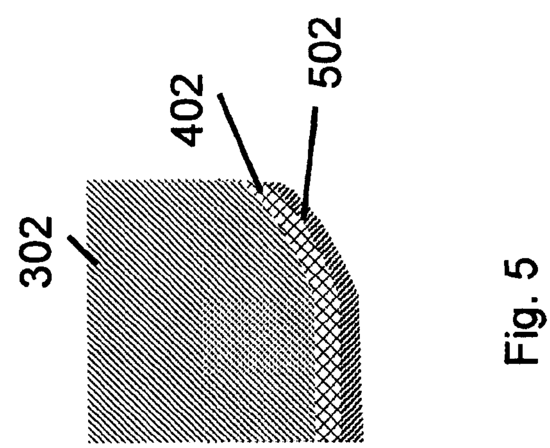

Referring to the example of FIG. 5, an opaque layer 502 is formed on the transparent wafer 302. The opaque layer 502 may be formed directly on the first layer 402. In an embodiment, the opaque layer 502 includes a metal composition. Example compositions of the opaque layer 502 include titanium (Ti), titanium nitride (TiN), aluminum (Al), tungsten (W), copper (Cu), gold (Au), and/or combinations thereof.

The method 200 then proceeds to block 208 where a conductive layer is formed on the substrate. In an embodiment, the conductive layer is a highly-doped silicon layer. The conductive layer may be formed using chemical vapor deposition. For example, the conductive layer may be formed using a plasma enhanced chemical vapor deposition process (PECVD) and/or other suitable process. In an embodiment, the silicon layer is doped with phosphorous. In an embodiment, the layer is doped such that a resistivity between approximately 0.001 and 1000 Ohm-cm is provided. The dopant may be introduced during the chemical vapor deposition process. In one example, the dopant is introduced using the CVD process via a phosphine ($PH_3$) precursor gas in an approximately 200 C and approximately 1 millitorr environment; however, numerous other process conditions may be possible. In an embodiment, the conductive layer is between approximately 0.1 .μm and approximately 100 μm in thickness. In an embodiment, the conductive layer has a resistivity of between approximately 0.001 and 1000 Ohm-cm. The conductivity may be tuned by altering the doping provided during the formation (e.g., CVD) of the conductive layer. Any reflectivity of incident radiation provided by the conductive layer may also be dependent upon the dopant concentration.

The conductive layer may provide a reflectivity of between approximately 50% and approximately 99% to incident radiation (including to light having red, green, and/or blue wavelengths). As described herein, the conductive layer and the opaque layer may together be described as a handling layer. The handling layer may provide for detection of the transparent substrate (e.g., wafer) during fabrication. The handling layer may provide a reflectively between approximately 50% and approximately 99% of the incident radiation (including to light having red, green, and/or blue wavelengths).

Figure 6:
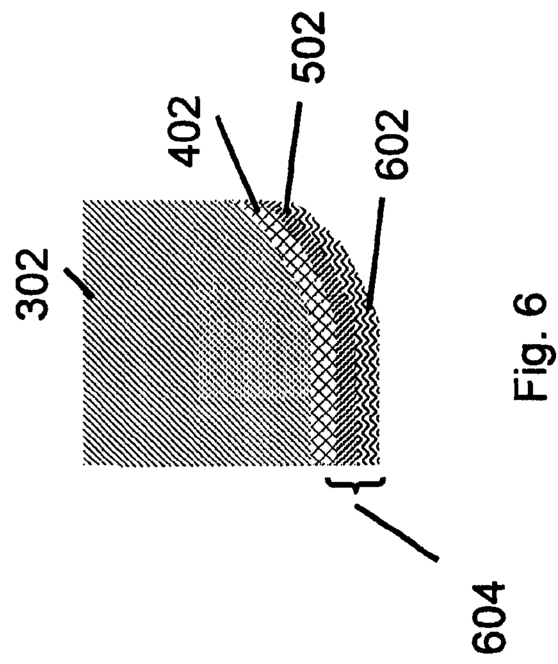

Referring to the example of FIG. 6, a conductive layer 602 is formed on the wafer 302 adjacent the opaque layer 502. The conductive layer 602 and the opaque layer 502 form a handling layer 604. The handling layer 604 may facilitate handling of the wafer 302 during processing including, allowing for detection of the wafer 302 or portion thereof by one or more fabrication tools. In an embodiment, the handling layer 604 is substantially similar to the handling layer 112, described above with reference to FIG. 1.

In embodiments, the method 200 may proceed to additional steps where a plurality of MEMs and/or CMOS features are formed on the substrate. The features may be formed on the substrate surface opposite the handling layer. In subsequent steps, the substrate (e.g., wafer) may be diced or otherwise separated to provide a plurality of devices each disposed on a transparent substrate. One or more of the first layer, opaque layer, and/or conductive layer may be removed from the substrate during the processing. In other embodiments, one or more of the first layer, opaque layer, and conductive layer remains on the substrate and is disposed on the resultant device (e.g., MEMs device). In an embodiment, one or more of the first layer, opaque layer, and conductive layer are disposed on the back-side of the resulting device (e.g., MEMs device).

In summary, the methods and devices disclosed herein provide a transparent wafer that has a handling layer formed thereon. The handling layer includes an opaque layer and a conductive layer. The transparent wafer having the handling layer is suitable for detection by wafer detection and/or alignment systems that typically use reflection as a means of detecting and/or aligning a wafer. In doing so, embodiments of the present disclosure offers several advantages over prior art devices. Advantages of one or more embodiments described the present disclosure include a resistance to further processing (e.g., resistant to oxide etching), a conductive path to minimize arcing, a design and method that is compatible with CMOS processing, and a low temperature forming process that may provide for tunable conductivity. Other desirable advantages of one or more embodiments include withstanding scratching, minimizing particle generation, minimizing contamination (e.g., metal contamination), avoiding static charge generation, minimizing bowing, and providing thermal conductivity. It is understood that different embodiments disclosed herein offer different disclosure, and that they may make various changes, substitutions and alterations herein without departing from the spirit and scope of the present disclosure.

Thus, provided in one embodiment is a device which includes a transparent substrate. An opaque layer is disposed on the transparent substrate. A conductive layer is disposed on the opaque layer. In an embodiment, the opaque layer includes metal. Example compositions of the opaque layer include titanium (Ti), titanium nitride (TiN), aluminum (Al), tungsten (W), copper (Cu), gold (Au), and/or combinations thereof. In an embodiment, the conductive layer includes silicon. For example, the conductive layer may be a doped silicon layer. In an embodiment, the dopant of the silicon layer is phosphorous.

One example of the embodiment, includes a first layer interposing the transparent substrate and the opaque layer. In an embodiment, the first layer is polysilicon or amorphous silicon. The transparent substrate may include quartz, glass, and/or other suitable material.

In another embodiment described herein, a device is illustrated which includes a transparent substrate having a first surface and a second surface opposing the first surface. At least one MEMs device is formed on the first surface. A handling layer is disposed on the second surface of the transparent substrate (e.g., backside). The handling layer includes an opaque layer and a conductive layer. The opaque layer is disposed on the second surface of the transparent substrate. The opaque layer includes metal. The conductive layer is disposed on the opaque layer and is a non-metal composition.

In one example, the conductive layer is a doped silicon layer. The doped silicon layer may be formed by CVD (e.g., PECVD). Examples of the metal of the opaque include aluminum, tungsten, copper, gold, titanium, titanium nitride, and combinations thereof. In one example, the conductive layer is between approximately 0.1 μm and approximately 100 μm in thickness.

The handling layer of one or more of the embodiments described may provide a reflectivity to incident radiation (e.g., infrared or visible light) of between approximately 50% and approximately 99%. Thus, the handling layer may be used to facilitate recognition and/or alignment of the transparent substrate.

In yet a further embodiment, a method of fabrication a device is provided. The method includes providing a transparent wafer. An opaque layer is formed on the transparent wafer. A conductive layer is deposited on the opaque layer using chemical vapor deposition. In an embodiment, the chemical vapor deposition includes a PECVD process. In an embodiment, the conductive layer is a doped silicon layer. The method may include forming a MEMs device on the transparent wafer.

In embodiment, the method may continue to include providing a radiation beam incident the transparent wafer. The radiation beam is reflected using at least one of the opaque layer and the conductive layer. The reflected radiation beam is then used to determine the presence of the transparent wafer.

What is claimed is:

1. A device, comprising:
- a transparent wafer having a top surface and an opposing back surface;
- a micro-electromechanical system (MEMS) device disposed on the top surface;
- an opaque layer disposed on the back surface of the transparent wafer; and
- a conductive layer disposed on the opaque layer, wherein the conductive layer includes a non-metal layer.

2. The device of claim 1, wherein the opaque layer includes metal.

3. The device of claim 1, wherein the opaque layer is selected from the group consisting of titanium (Ti), titanium nitride (TiN), aluminum (Al), tungsten (W), copper (Cu), gold (Au), and combinations thereof.

4. The device of claim 1, wherein the opaque layer includes titanium.

5. The device of claim 1, wherein the conductive layer includes silicon.

6. The device of claim 1, wherein the conductive layer is a doped silicon layer.

7. The device of claim 6, wherein the doped silicon layer includes phosphorous.

8. The device of claim 1, further comprising:
- a first layer interposing the transparent wafer and the opaque layer.

9. The device of claim 8, wherein the first layer includes at least one of amorphous silicon and polysilicon.

10. The device of claim 1, wherein the transparent wafer includes quartz.

11. A device, comprising:
- a transparent substrate having a first surface and a second surface opposing the first surface, wherein at least one MEMs device is formed on the first surface; and
- a handling layer disposed on the second surface of the transparent substrate, wherein the handling layer includes:
  - an opaque layer disposed on the second surface of the transparent substrate, wherein the opaque layer includes metal; and
  - a conductive layer disposed on the opaque layer, wherein the conductive layer is a non-metal layer.

12. The device of claim 11, wherein the conductive layer is a doped silicon layer.

13. The device of claim 11, wherein the metal of the opaque layer is selected from the group consisting of aluminum, tungsten, copper, gold, titanium, titanium nitride, and combinations thereof.

14. The device of claim 11, wherein the conductive layer is between approximately 0.1 μm and approximately 100 μm in thickness.

15. The device of claim 11, wherein the handling layer provides a reflectivity to incident radiation of between approximately 50% and approximately 99%.

16. The device of claim 11, wherein the conductive layer includes silicon formed by chemical vapor deposition.

17. A method of fabricating a wafer, the method comprising:
- providing a transparent wafer having a first surface and an opposing second surface;
- forming an opaque layer on the second surface of the transparent wafer;
- depositing a conductive layer on the opaque layer using chemical vapor deposition; and
- forming a micro-electromechanical system (MEMS) device on the first surface of the transparent wafer.

18. The method of claim 17, wherein the depositing including using plasma enhanced chemical vapor deposition.

19. The method of claim 17, wherein the depositing the conductive layer includes forming a doped silicon layer.

20. The method of claim 17, further comprising:
- providing a radiation beam, wherein the radiation beam is incident the transparent wafer;
- reflecting the radiation beam using at least one of the opaque layer and the conductive layer; and
- using the reflected radiation beam to determine the presence of the transparent wafer.

* * * * *